(12) United States Patent
Lee et al.

(10) Patent No.: US 11,479,697 B2
(45) Date of Patent: Oct. 25, 2022

(54) ADHESIVE SHEET HAVING EXCELLENT ULTRAVIOLET BLOCKING FUNCTION, ADHESIVE COMPOSITION, AND DISPLAY DEVICE COMPRISING SAME

(71) Applicant: LMS Co., Ltd., Pyeongtaek-si (KR)

(72) Inventors: Eun Mi Lee, Hwaseong-si (KR); Han Byul Lee, Seoul (KR); Hye Ryong Kim, Osan-si (KR); Ho Seong Na, Pyeongtaek-si (KR)

(73) Assignee: LMS CO., LTD., Pyeongtaek-si (KR)

( * ) Notice: Subject to any disclaimer, the term of this patent is extended or adjusted under 35 U.S.C. 154(b) by 351 days.

(21) Appl. No.: 16/643,793

(22) PCT Filed: Aug. 29, 2018

(86) PCT No.: PCT/KR2018/009950
§ 371 (c)(1),
(2) Date: Mar. 2, 2020

(87) PCT Pub. No.: WO2019/045433
PCT Pub. Date: Mar. 7, 2019

(65) Prior Publication Data
US 2020/0216721 A1    Jul. 9, 2020

(30) Foreign Application Priority Data

Sep. 1, 2017 (KR) .................. 10-2017-0111971

(51) Int. Cl.
*C09J 7/38* (2018.01)
*C09J 11/06* (2006.01)
(Continued)

(52) U.S. Cl.
CPC .................. *C09J 11/06* (2013.01); *B32B 7/12* (2013.01); *C09J 7/10* (2018.01); *C09J 7/38* (2018.01);
(Continued)

(58) Field of Classification Search
CPC ....... C09J 11/06; C09J 7/10; C09J 7/38; C09J 2301/408; B32B 7/12; G02B 5/208; G02B 5/3041; C08K 5/3492; C09K 2323/05
(Continued)

(56) References Cited

U.S. PATENT DOCUMENTS

2016/0093833 A1    3/2016    No et al.

FOREIGN PATENT DOCUMENTS

| JP | 2002-53824 A | 2/2002 |
| JP | 2007-284516 A | 11/2007 |

(Continued)

OTHER PUBLICATIONS

International Search Report dated Jan. 2, 2019, corresponding to International Application No. PCT/KR2018/009950 citing the above reference(s).

(Continued)

*Primary Examiner* — Ruiyun Zhang
(74) *Attorney, Agent, or Firm* — Hauptman Ham, LLP

(57) ABSTRACT

The present invention discloses an adhesive sheet which effectively blocks light in a ultraviolet region without impairing the transmittance of light in a visible light region and adhesion, an adhesive composition comprising a binder resin, and a light absorbing dye dispersed in the binder resin, and the present invention can effectively block light in a wavelength range of 410 nm or less, and can be applied to various kinds of display devices.

18 Claims, 2 Drawing Sheets

(51) Int. Cl.
*C09J 7/10* (2018.01)
*B32B 7/12* (2006.01)
*G02B 5/20* (2006.01)
*G02B 5/30* (2006.01)
*H01L 27/32* (2006.01)
*H01L 51/52* (2006.01)
*C08K 5/3492* (2006.01)

(52) U.S. Cl.
CPC ............ *G02B 5/208* (2013.01); *G02B 5/3041* (2013.01); *H01L 27/323* (2013.01); *H01L 51/5281* (2013.01); *C08K 5/3492* (2013.01); *C09J 2203/00* (2013.01); *C09J 2301/408* (2020.08); *C09K 2323/05* (2020.08)

(58) Field of Classification Search
USPC .................................. 428/1.5, 1.54; 359/361
See application file for complete search history.

(56) References Cited

FOREIGN PATENT DOCUMENTS

| KR | 20-2012-0006849 U | 10/2012 | |
|---|---|---|---|
| KR | 10-2016-0038143 A | 4/2016 | |
| KR | 10-1766284 B1 | 8/2017 | |
| WO | WO-2017222328 A1 * | 12/2017 | ............... B32B 7/12 |

OTHER PUBLICATIONS

Written opinion dated Jan. 2, 2019, corresponding to PCT/KR2018/009950 citing the above reference(s).

\* cited by examiner

ADHESIVE SHEET HAVING EXCELLENT ULTRAVIOLET BLOCKING FUNCTION, ADHESIVE COMPOSITION, AND DISPLAY DEVICE COMPRISING SAME

CROSS-REFERENCE TO RELATED APPLICATION(S)

This application is a National Phase Entry of PCT International Application No. PCT/KR2018/009950 which was filed on Aug. 29, 2018, and claims priority to Korean Patent Application No. 10-2017-0111971, which was filed on Sep. 1, 2017, the contents of which are incorporated herein by reference.

BACKGROUND

1. Field

The present invention relates to an adhesive sheet, an adhesive composition, and a display device including the same, having an excellent UV blocking function.

2. Description of the Related Art

Recently, flat panel displays have drawn attention as display devices. These flat panel display devices include display devices like liquid crystal display (Liquid Crystal Display), plasma display (Plasma Display Panel) and organic light emitting display devices (Organic Light Emitting Device).

Among them, the organic light emitting display device has a wide viewing angle with fast response time, thus it is possible to implement a high-quality display. In particular, an organic light emitting display device having a microcavity structure can increase the output efficiency utilizing a light resonance effect occurring between an upper and a lower electrode and thus it is advantageous to possibly increase light color purity. The organic light emitting display device comprises a substrate, a first transparent electrode formed on the substrate, an organic layer formed on the first transparent electrode and a second electrode formed on the organic layer and having a high reflective rate. Typically, a substrate is used such as a glass substrate or a plastic substrate. And, the organic layer includes a hole injection layer, a hole transport layer, a light generation layer, a hole blocking layer and an electron transport layer. In other words, a multilayer structure organic light emitting display device is manufactured by stacking a plurality of organic layers between the first electrodes and the second electrodes.

However, these display devices have a problem in that they do not effectively block the light in the ultraviolet region, which reduces the visibility of the device, and in particular, causes the durability of the device in the outdoor use environment to deteriorate where sunlight is irradiated.

SUMMARY

An object of the present invention is to provide an adhesive sheet and an adhesive composition that effectively blocks the light in the ultraviolet region without reducing the transmittance of the light in the visible region and adhesion to the light in the visible region.

Another object of the present invention is to provide a display device including the adhesive sheet or the adhesive composition.

To solve the above object of the present invention,
The present invention in one embodiment,
it has a structure in which a light absorbing dye is dispersed in an adhesive binder resin;
the content of the light absorbing dye is 80 parts by weight or less with reference to 100 parts by weight of the adhesive binder resin;
it satisfies following conditions 1 and 2;
[Condition 1]
the light transmittance for a wavelength of 405 nm is 5% or less;
the light transmittance for a wavelength of 410 nm is 10% or less; and
the light transmittance for a wavelength of 420 nm is less than 60%; and
[Condition 2]
light transmittance of more than 75% for 430 nm wavelength; and
an adhesive sheet comprising a first light absorbing dye which is a triazine ultraviolet absorber, and a second light absorbing dye represented by following Formula 2.

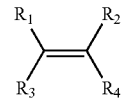

[Formula 2]

In Formula 2,
$R_1$ to $R_3$ are each independently represented by hydrogen, a cyano group, or following formula 2-a;

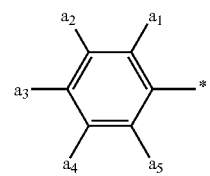

[Formula 2-a]

in Formula 2-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20, or an aryl group having a carbon number of 6 to 18;
$R_4$ is represented by hydrogen, a cyano group, or following formula 2-b;

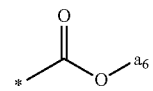

[Formula 2-b]

from Formula 2-b,
$a_6$ is hydrogen or an alkyl group having a carbon number of 1 to 18;
one or more hydrogen for $R_1$ to $R_4$ from the above formula 2 is each independently substitute or unsubstituted by an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, and one selected from a group consisted of a halogen group, a cyano group, a nitro group, a hydroxyl group and a carboxyl group.

In another embodiment, the present invention includes,
a binder resin; and
a light absorption dye dispersed in the binder resin; wherein
the light absorption dye provides an adhesive composition comprising a first light absorption dye which is a triazine-based ultraviolet absorber and a second light absorption dye represented by the formula 2 below.

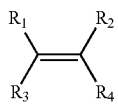

[Formula 2]

In Formula 2,
$R_1$ to $R_3$ are each independently represented by hydrogen, a cyano group, or following formula 2-a;

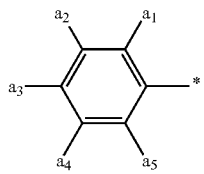

[Formula 2-a]

in Formula 2-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20, or an aryl group having a carbon number of 6 to 18;
$R_4$ is represented by hydrogen, a cyano group, or following formula 2-b;

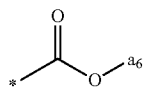

[Formula 2-b]

in Formula 2-b,
$a_6$ is hydrogen or an alkyl group having a carbon number of 1 to 18;
one or more hydrogen for $R_1$ to $R_4$ from the above formula 2 is each independently substitute or unsubstituted by an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, and one selected from a group consisted of a halogen group, a cyano group, a nitro group, a hydroxyl group and a carboxyl group.

In one embodiment, the present invention provides an adhesive sheet formed of the adhesive composition described above.

In another embodiment, the present invention provides a display device comprising an adhesive layer formed of the above-described adhesive composition. Specifically, the display device includes a display panel; polarizing film; and a light-transparent window layer; and
the adhesive layer may be formed at any one or more positions,
between the display panel and the polarizing film;
inside the polarizing film; and
between the polarizing film and the light-transparent window layer Advantageous Effect The adhesive composition and/or the adhesive sheet according to the invention can effectively block a region of light which is wavelength of 410 nm or less while not lowering the light transmittance and the adhesive performance in the visible light region and can be applied to various types of display devices.

MODE FOR CARRYING OUT THE INVENTION

Figure 1:
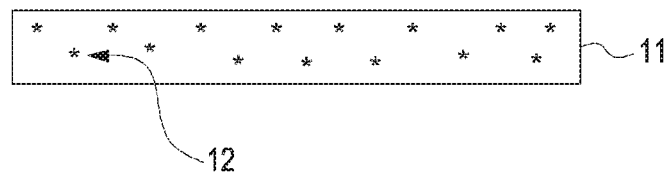
FIG. 1 is a cross-sectional view of an adhesive sheet structure according to one embodiment of the present invention.

Since the present invention provides various changes and can have many different embodiments, specific embodiments are illustrated in figures and detail descriptions are stated.

However, such descriptions are not limited to a specific embodiment of the present invention and it must be understood to include all the modifications, equivalents or substitutions within the scope and the technical field of the present invention.

In the present invention, terms such as "include," "comprise" or "configure" are to indicate numbers, steps, operations, elements, components, or existence of the combination in the described specification and should be understood not to exclude numbers, steps, operations, elements, components, or existence or possible addition of the combination in advance.

In addition, it should be understood that the attached drawings in the present invention are depicted enlarged or reduced for the convenience of explanation.

Hereinafter, the present invention will be described in detail with the reference to the drawings and the same or corresponding components regardless of reference numerals are assigned the same reference numerals and overlapping description will be omitted.

In addition, in the present invention, the "alkyl group" is a substituent group derived from a saturated hydrocarbon linear or branched form.

In this case, as for the "alkyl group," for example, it can be a methyl group, an ethyl group, an n-propyl, an isopropyl group, a n-butyl group, a sec-butyl group, a t-butyl group, a n-pentyl group, a 1,1-dimethyl-propyl group, a 1,2-dimethyl-propyl group, a 2,2-dimethyl-propyl group, a 1-ethyl-propyl group, a 2-ethyl-propyl group, a n-hexyl group, a 1-methyl-2-ethyl-propyl group, a 1-ethyl-2-methyl-propyl group, a 1,1,2-trimethyl-propyl group, a 1-propyl-propyl group, a 1-methyl-butyl group, a 2-methyl-butyl group, a 1,1-dimethyl-butyl group, a 1,2-dimethyl-butyl group, a 2,2-dimethyl-butyl group, a 1,3-dimethyl-butyl group, a 2,3-dimethyl-butyl group, a 2-ethyl-butyl group, a 2-methyl-pentyl group, a 3-methyl-pentyl group, a n-octyl group, and a 2-ethylhexyl group, etc.

In addition, the "alkyl group" may have 1 to 20 carbon numbers, for example, 1 to 12 carbon numbers, 1 to 6 carbon numbers, or 1 to 4 carbon number.

Furthermore, in the present invention, the "cycloalkyl group" is a substituent group derived from a monocyclic saturated hydrocarbon.

As for the "cycloalkyl group," for example, it can be a cyclopropyl group, a cyclobutyl group, a cyclo-pentyl group, a cyclohexyl group, a cycloheptyle group, and a cyclooctyl group, etc.

In addition, the "cycloalkyl group" may have 3 to 20 carbon numbers, for example, 3 to 12 carbon atoms or 3 to 6 carbon atoms.

In addition, in the present invention, "aryl group (aryl group)" is one monovalent substituent group derived from an aromatic hydrocarbon.

At this time, as for the "aryl group," for example, it can be a phenyl group, a naphthyl group, an anthracenyl group, a phenanthryl group, a naphthacenyl group, a pyrenyl group, a tolyl group, a biphenyl group, a terphenyl group, a chrycenyl group, a spirobifluorenyl group, a fluoranthenyl group, a fluorenyl group, a perylenyl group, an indenyl group, an azulenyl group, a heptalenyl group, a phenalenyl group, and a phenanthrenyl group, etc.

In addition, the "aryl group" may have 6 to 30 carbon numbers, for example, 6 to 10 carbon numbers, 6 to 14 carbon numbers, 6 to 18 carbon numbers or 6 to 12 carbon numbers.

In addition, in the present invention, a "heteroaryl group" is a monocyclic or "aromatic heterocyclic ring" or "heterocyclic" derived from a condensed ring. The "heteroaryl group" can have at least one, for example, one, two, three or four of nitrogen (N), sulfur (S), oxygen (O), phosphorus (P), selenium (Se), and silicon (Si) for a hetero atom.

In this case, as for the "heteroaryl group," for example, it can be a nitrogen-containing heteroaryl group including a pyrrolyl group, a pyridyl group, a pyridinyl group, a pyridazinyl group, a pyrimidinyl group, a pyrazinyl group, a triazolyl group, a tetrazolyl group, a benzotriazolyl group, a pyrazolyl group, an imidazolyl group, a benzimidazolyl group, an indolyl group, an indolinyl group, an isoindolyl group, an indolizinyl group, a purinyl group, an indazolyl group, a quinolyl group, an isoquinolinyl group, a quinolizinyl group, a phthalazinyl group, a naphthylidinyl group, a quinoxalinyl group, a quinazolinyl group, a cinnolinyl group, a pteridinyl group, an imidazotriazinyl group, an acridinyl group, a phenanthridinyl group, a carbazolyl group, a carbazolinyl group, a pyrimidinyl group, a phenanthrolinyl group, a phenazinyl group, an imidazopyridinyl group, an imidazopyrimidinyl group, and a pyrazolopyridinyl group; a sulfur-containing heteroaryl group including a thienyl group, a benzothienyl group, and a dibenzothienyl group; and an oxygen-containing heteroaryl group including a furyl group, a pyranyl group, a cyclopentapyranyl group, a benzofuranyl group, an isobenzofuranyl group, a dibenzofuranyl group, a benzodioxole group, a benzotrioxole group, etc.

Furthermore, as for the "heteroaryl group" in the specific example, it can be a composition including two or more hetero atoms such as a thiazolyl group, an isothiazolyl group, a benzothiazolyl group, a benzothiadiazolyl group, a phenothiazinyl group, an isoxazolyl group, a furazanyl group, a phenoxazinyl group, an oxazolyl group, a benzoxazolyl group, an oxadiazolyl group, a pyrazoloxazolyl group, an imidazothiazolyl group, a thienofuranyl group, a furopyrrolyl group, pyridoxazinyl group, etc.

Furthermore, the "heteroaryl group" may have 2 to 20 carbon numbers, for example, 4 to 19 carbon numbers, 4 to 15 carbon numbers or 5 to 11 carbon numbers. For example, if a heteroatom is included, the heteroaryl group can have a ring member of 5 to 21.

In addition, in the present invention, "an aralkyl group (aralkyl group)" is a saturated hydrocarbon substituent to which one monovalent substituent derived from an aromatic hydrocarbon is combined at the hydrogen position of a terminal hydrocarbon. In other words, "the aralkyl group" means an alkyl group where a chain terminal is substituted with an aryl group, and as an example, a benzyl group, a phenethyl group, a phenylpropyl group, a naphthalenylmethyl group, and a naphthalenylethyl group, etc.

In addition, in the present invention, "adhesive" is a general term for a case where the adhesion is present with an adjacent base material and includes both the case of the adhesiveness or adhesion according to the degree of tackiness.

Here, the present invention will be described in detail.

The present invention provides an adhesive sheet having a structure in which a light absorption dye is dispersed in an adhesive binder resin. In one example, the adhesive sheet has the content of the light absorbing dye of 60 parts by weight or less with the reference to 100 parts by weight of the adhesive binder resin; and following conditions 1 and 2 are satisfied.

[Condition 1]

The light transmittance for a wavelength of 405 nm is 5% or less;

the light transmittance for a wavelength of 410 nm is 10% or less; and the light transmittance for wavelength of 420 nm is 60% or less; and

[Condition 2]

the light transmittance for the 430 nm wavelength is greater than 75%.

More specifically, the adhesive sheet according to the present invention may be a structure including a light-absorbing dye. In one example, the adhesive sheet according to the present invention has a structure including the light-absorbing dye dispersed in a resin matrix and the matrix resin.

In addition, the adhesive sheet may satisfy following condition 3.

$$|T_{20\%}-T_{10\%}|<5(nm),$$  [Condition 3]

$T_{20\%}$ represents the wavelength at the point where light transmittance is 20% in the wavelength range of 405 to 430 nm and $T_{10\%}$ represents the wavelength at the point where the light transmittance is 10% in the wavelength range of 405 to 430 nm.

It can be seen through the above Condition 3 that the adhesive sheet according to the present invention shows very steep slope of the light absorption spectrum in 405 to 430 nm wavelength region. Through this, it can be seen that light below 405 nm wavelength region is effectively cut off while light transmission above 430 nm wavelength region is not deteriorated at the same time.

In particular, the adhesive sheet according to the present invention, light which is below 410 nm wavelength region, is effectively cut-off. Through this, by applying the adhesive sheet to a display device, it is possible to prevent or reduce color change or color coordinate shift due to UV irradiation when it is exposed to sun light.

More specifically, the adhesive sheet can satisfy Condition 4 and 5 stated below.

[Condition 4]

The light transmittance is 0.5% or less in average with respect to below 405 nm wavelength;

the light transmittance is 5% or less with respect to 410 nm wavelength; and the light transmittance is 52% or less with respect to 420 nm wavelength.

[Condition 5]

The light transmittance is more than 78% with respect to 430 nm wavelength.

Although the thickness of the adhesive sheet is not particularly limited if it is in applicable range for the display device, it can be in the average of 5 μm to 350 μm range. Specifically, the thickness of the adhesive sheet may have an average of 100 μm to 300 μm range or 10 μm to 30 μm. On the other hand, when the thickness of the adhesive sheet is in the range of an average of 10 μm to 30 μm, the adhesion strength can be properly maintained.

On the other hand, when the thickness of the adhesive sheet is in the average of 10 μm to 30 μm range, the adhesion strength of the adhesive sheet with respect to a glass is 360 gf/inch or above and more specifically, it may be in the 360 gf/inch to 500 gf/inch range or 370 gf/inch to 450 gf/inch range.

Or, the adhesive strength of the 16 μm adhesive sheet with respect to a glass is in the 360 gf/inch to 500 gf/inch range or in the 370 gf/inch to 450 gf/inch range in accordance with an embodiment of the present invention.

When the adhesive strength of the adhesive sheet in within the range stated above, it is advantageous for having a sufficient anti-scattering effect and for easy rework process for glass rehabilitation from a defect glass.

The adhesive sheet according to the present invention includes all the cases for manufacturing adhesive composition as a film type or for manufacturing by depositing it on a subject substrate. Because a manufacturing process of a film utilizing the adhesive composition is a publicly available process, the detail explanation shall be omitted In addition, the adhesive sheet may further include a release film formed on one side or both sides of the adhesive sheet. This is for easy handling and easy transfer for a respective process step.

In addition, the adhesive sheet may further include an optical film. For example, the optical film includes a polarizing film case. For example, such an adhesive sheet can be applied to various types of display devices.

The adhesive sheet according to the present invention may further include a particulate component. For example, the adhesive layer further comprises a particulate component having the average refractive index of 1.3 to 2.1.

The polarizing film may be a laminated structure including a polarizer and a retardation film. As one example, the polarizing film may include the adhesive layer or the adhesive sheet described above between the polarizer and the retardation film. The polarizer may be, for example, a TAC/PVA/TAC structure. In addition, the retardation film may be a structure formed of PC, COP or a separate coating layer. For example, the retardation film may be a λ/4 or λ/2 retardation film.

The adhesive sheet according to the present invention confirmed that light in the ultraviolet region can be selectively cut-off by using the mixture of light absorbing dye.

For example, the adhesive sheet includes a first light-absorbing dye which is a triazine-based ultraviolet absorber and a second light-absorbing dye which is represented as Formula 2 stated below.

On the other hand, the first light-absorbing dye which is a triazine-based ultraviolet absorber may be represented as Formula 1 stated below.

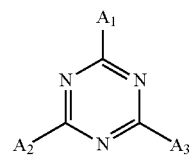

[Formula 1]

In Formula 1, $A_1$, $A_2$ and $A_3$ are each independently, hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

at least one of $A_1$, $A_2$ and $A_3$ is represented by following Formula 1-a;

at least one of $A_1$, $A_2$ and $A_3$ is represented by following Formula 1-b; and

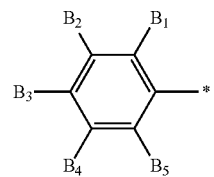

[Formula 1-a]

in Formula 1-a;

$B_1$ to $B_5$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

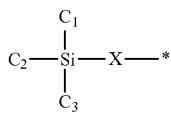

[Formula 1-b]

in Formula 1-b;

$C_1$ to $C_3$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

X represents an oxygen, sulfur or nitrogen atom;

one or more hydrogen of $A_1$, $A_2$ and $A_3$ in Formula 1 are each independently substituted or unsubstituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, a halogen group, a cyano group, a nitro group, a hydroxy group and a carboxyl group; and

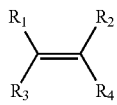

[Formula 2]

in Formula 2, $R_1$ to $R_3$, each independently represents hydrogen, a cyano group, or following Formula 2-a stated below,

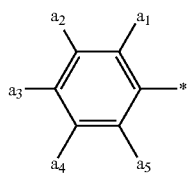

[Formula 2-a]

in Formula 2-a in, $a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

$R_4$ represents hydrogen, a cyano group or following Formula 2-b stated below,

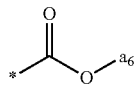

[Formula 2-b]

in Formula 2-b, $a_6$ is hydrogen or an alkyl group having a carbon number of 1 to 18; and one of more hydrogen of $R_1$ to $R_4$ in Formula 2 are each independently substituted or unsubstituted with at least one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, a alkoxycarbonyl group having a carbon number of 1 to 6, a halogen group, a cyano group, a nitro group, a hydroxyl group and a carboxyl group.

More specifically, a first light-absorbing dye represented as Formula 1 stated above is represented by following Formula 3.

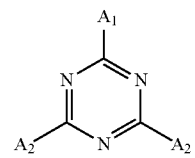

[Formula 3]

In Formula 3, $A_2$ is unsubstituted or a benzene structure substituted with an alkyl group having a carbon number of 1 to 6 or an aryl group having a carbon number of 6 to 20; and $A_1$ is represented by Formula 3-b,

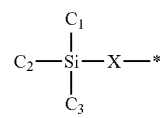

[Formula 3-b]

in Formula 3-b, $C_1$ to $C_3$ are each independently, hydrogen, a hydroxy group, an alkyl group having a carbon number of 1 to 20, an alkoxy group having a carbon number of 1 to 10 or an aryl group having a carbon number of 6 to 18; and X represents an oxygen, sulfur or nitrogen atom.

In addition, a second light-absorbing dye represented by Formula 2 above is represented by following Formula 4.

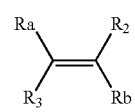

[Formula 4]

In Formula 4, $R_2$ is a cyano group, $R_3$ is hydrogen,

Ra is represented by following Formula 4-a, and

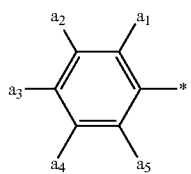
[Formula 4-a]

in Formula 4-a, $a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

Rb is represented by following Formula 4-b and

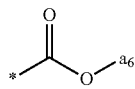
[Formula 4-b]

in Formula 4-b, $a_6$ is hydrogen or an alkyl group having a carbon number of 1 to 10.

One or more hydrogen of $R_2$, $R_3$, Ra and Rb in Formula 4 are each independently substituted or unsubstituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, halogen group, a cyano group, a nitro group, a hydroxyl group and a carboxy group.

In addition, the adhesive sheet according to the present invention can minimize color change, in other words, color temperature change for the display device because it can implement excellent light resistance by minimizing the spectral transmittance due to exposure to sunlight. Specifically, an experiment was done for the adhesive sheet to be exposed to solar irradiation for 8 hours and then unexposed for 8 hours repeatedly for 45 times under the temperature of 85° C. condition, and the difference between the spectral transmittance (To,%) with respect to 405 nm wavelength taken before the experiment and the spectral transmittance ($T_1$,%) with respect to the same wavelength after the experiment was calculated. For solar irradiation, a xenon lamp with an luminance of 700-900 W/m² was used.

In one example, the adhesive sheet satisfies following Condition 6 when the solar irradiation experiment is performed.

$|T_1-T_0| \leq 5(\%)$  [Condition 6]

In Condition 6, $T_0$ represents the transmittance with respect to 405 nm wavelength light taken from a sample before the sunlight exposure experiment, and $T_1$ represents the transmittance with respect to 405 nm wavelength light taken from a sample after the sunlight exposure experiment.

More specifically, it was experimentally confirmed that the amount of the spectral transmittance change according to the Condition 6 above is a range of 5% or less, 3% or less or 1% or less.

In addition, the present invention provides an adhesive composition, and in one embodiment, the adhesive composition includes a binder resin; and a light absorbing dye dispersed in the binder resin, and The light-absorbing dye includes a first light-absorbing dye which is a triazine-based ultraviolet absorber and the first light-absorbing dye represented by following FORMULA 2.

On the other hand, the first light-absorbing dye which is a triazine-based ultraviolet absorber may be represented by following Formula 1.

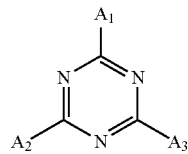
[Formula 1]

In Formula 1, $A_1$, $A_2$ and $A_3$ are each independently, hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18; at least one of $A_1$, $A_2$ and $A_3$ is represented by following Formula 1-a; at least one of $A_1$, $A_2$ and $A_3$ is represented by following Formula 1-b; and

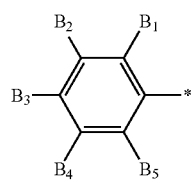
[Formula 1-a]

in Formula 1-a;

$B_1$ to $B_5$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

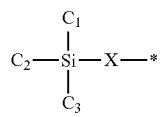
[Formula 1-b]

in Formula 1-b;

$C_1$ to $C_3$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

X represents an oxygen, sulfur or nitrogen atom;

one or more hydrogen of $A_1$, $A_2$ and $A_3$ in Formula 1 are each independently substituted or unsubstituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group a carbon number of 6 to 20, an alkoxycarbonyl group having a carbon number of 1 to 6, a halogen group, a cyano group, a nitro group, a hydroxy group and a carboxyl group; and

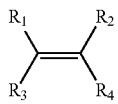

[Formula 2]

in Formula 2, $R_1$ to $R_3$, each independently represents hydrogen, a cyano group, or following Formula 2-a stated below,

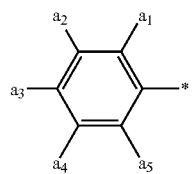

[Formula 2-a]

in Formula 2-a in, $a_1$ to as are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

$R_4$ represents hydrogen, a cyano group or following Formula 2-b stated below,

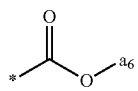

[Formula 2-b]

in Formula 2-b, $a_6$ is hydrogen or an alkyl group having a carbon number of 1 to 18; and one of more hydrogen of $R_1$ to $R_4$ in Formula 2 are each independently substituted or unsubstituted with at least one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, a alkoxycarbonyl group having a carbon number of 1 to 6, a halogen group, a cyano group, a nitro group, a hydroxyl group and a carboxyl group.

More specifically, a first light-absorbing dye represented as Formula 1 stated above is represented by following Formula 3.

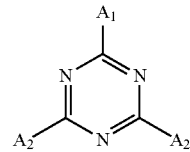

[Formula 3]

In Formula 3, $A_2$ is unsubstituted or a benzene structure substituted with an alkyl group having a carbon number of 1 to 6 carbon or an aryl group having a carbon number of 6 to 20; and $A_1$ is represented by Formula 3-b,

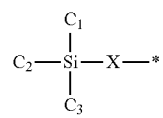

[Formula 3-b]

in Formula 3-b, $C_1$ to $C_3$ are each independently, hydrogen, a hydroxy group, an alkyl group having a carbon number of 1 to 20, an alkoxy group having a carbon number of 1 to 10 or an aryl group having a carbon number of 6 to 18; and X represents an oxygen, sulfur or nitrogen atom.

For example, the first light-absorbing dyes can be represented by one or more structures of following Formula 2-1 to 2-3.

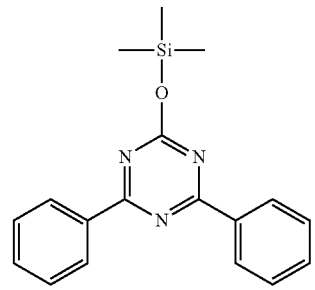

[Formula 2-1]

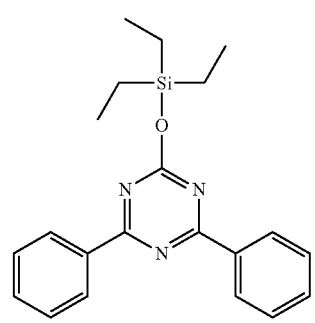

[Formula 2-2]

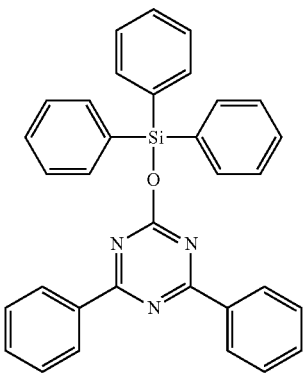

In addition, the second light-absorbing dye as represented by Formula 2 may be represented by following Formula 4.

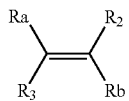

[Formula 4]

In Formula 4,
$R_2$ is a cyano group,
$R_3$ is hydrogen,
Ra is represented by following Formula 4-a, and

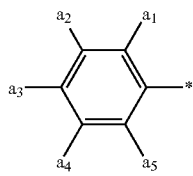

[Formula 4-a]

in Formula 4-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

Rb is represented by following Formula 4-b and

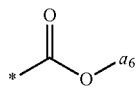

[Formula 4-b]

in Formula 4-b,
$a_6$ is hydrogen or an alkyl group having a carbon number of 1 to 10.

One or more hydrogen of $R_2$, $R_3$, Ra and Rb in Formula 4 are each independently substituted or unsubstituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, halogen group, a cyano group, a nitro group, a hydroxyl group and a carboxy group.

For example, compounds $R_1$ to $R_4$, represented by Formula 2 above include cases in following Table 1.

TABLE 1

| No. | $R_1$ | $R_2$ | $R_3$ | $R_4$ |
|---|---|---|---|---|
| 1 | phenyl | —H | —H | —C(=O)O-octyl |
| 2 | biphenyl | —H | —H | —C(=O)O-heptyl |
| 3 | phenyl | —CN | —CN | —C(=O)OH |
| 4 | biphenyl | —CN | —CN | —C(=O)O-isobutyl |
| 5 | phenyl | —H | —CN | —C(=O)O-isobutyl |

TABLE 1-continued

| No. | R₁ | R₂ | R₃ | R₄ |
|---|---|---|---|---|
| 6 | biphenyl-4-yl | —H | —CN | isobutyl ester (—C(O)O—CH₂CH(CH₃)₂) |
| 7 | phenyl | —CN | —H | n-octyl ester (—C(O)O—(CH₂)₇CH₃) |
| 8 | biphenyl-4-yl | —CN | —H | 2-ethylhexyl ester |
| 9 | 4-methoxyphenyl | —H | —H | n-hexyl ester |
| 10 | 3,4-dimethoxyphenyl | —H | —H | n-hexyl ester |
| 11 | 4-methoxyphenyl | —CN | —CN | isobutyl ester |
| 12 | 3,4-dimethoxyphenyl | —CN | —CN | n-octyl ester |
| 13 | 4-methoxyphenyl | —H | —CN | isobutyl ester |
| 14 | 3,4-dimethoxyphenyl | —H | —CN | isobutyl ester |
| 15 | 4-methoxyphenyl | —CN | —H | 2-ethylhexyl ester |
| 16 | 3,4-dimethoxyphenyl | —CN | —H | 2-ethylhexyl ester |

TABLE 1-continued

| No. | R₁ | R₂ | R₃ | R₄ |
|-----|-----|-----|-----|-----|
| 17 | 3,4-diethoxyphenyl | —H | —H | —C(=O)O-octyl |
| 18 | 4-tert-butylphenyl | —H | —H | —C(=O)O-hexyl |
| 19 | 3,4-diethoxyphenyl | —CN | —CN | —C(=O)O-octyl |
| 20 | 4-tert-butylphenyl | —CN | —CN | —C(=O)OH |
| 21 | 3,4-diethoxyphenyl | —H | —CN | —C(=O)O-isobutyl |
| 22 | 4-tert-butylphenyl | —H | —CN | —C(=O)O-isobutyl |
| 23 | 3,4-diethoxyphenyl | —CN | —H | —C(=O)O-octyl |
| 24 | 4-tert-butylphenyl | —CN | —H | —C(=O)O-hexyl |
| 25 | 4-cyclohexylphenyl | —H | —H | —C(=O)O-octyl |
| 26 | 4-benzylphenyl | —H | —H | —C(=O)O-hexyl |
| 27 | 4-cyclohexylphenyl | —CN | —CN | —C(=O)O-octyl |

TABLE 1-continued
| No. | R₁ | R₂ | R₃ | R₄ |
|---|---|---|---|---|
| 28 | 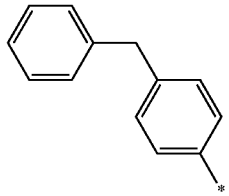 [SMILES: *c1ccc(Cc2ccccc2)cc1] | —CN | —CN | 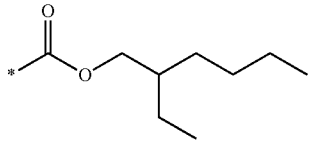 [SMILES: *C(=O)OCC(CC)CCCC] |
| 29 | 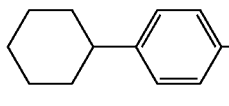 | —H | —CN | 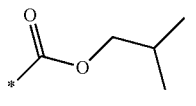 [SMILES: *C(=O)OCC(C)C] |
| 30 | 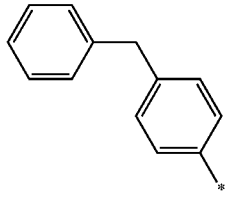 | —H | —CN | 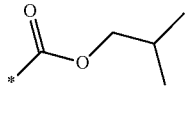 [SMILES: *C(=O)OCC(C)C] |
| 31 | 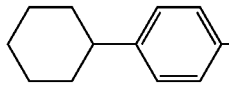 | —CN | —H | 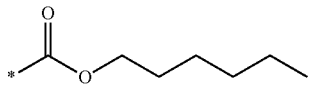 [SMILES: *C(=O)OCCCCCC] |
| 32 | 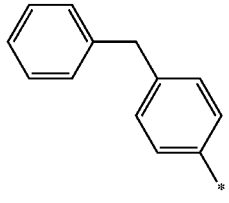 | —CN | —H | 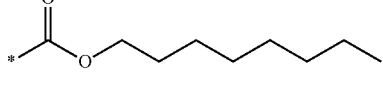 |
| 33 | 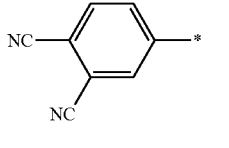 | —H | —H | 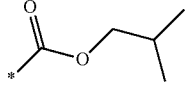 [SMILES: *C(=O)OCC(C)C] |
| 34 | 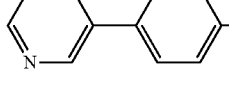 | —H | —H | 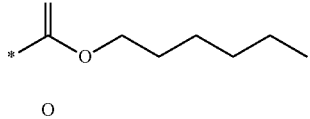 |
| 35 | 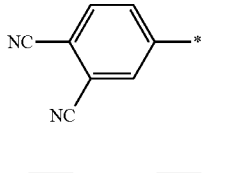 [SMILES: *c1ccc(C#N)c(C#N)c1] | —CN | —CN | 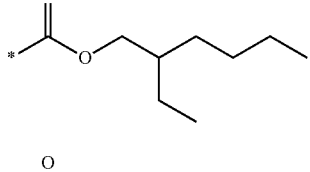 |
| 36 | 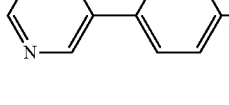 | —CN | —CN | 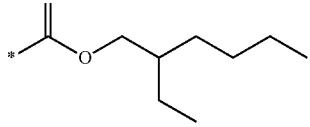 |
| 37 | 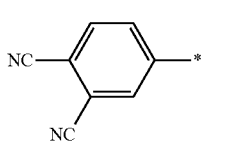 | —H | —CN | 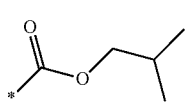 [SMILES: *C(=O)OCC(C)C] |

TABLE 1-continued
| No. | R₁ | R₂ | R₃ | R₄ |
|---|---|---|---|---|
| 38 | 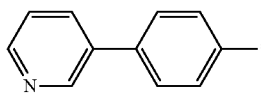 | —H | —CN | 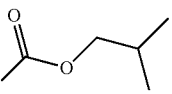 |
| 39 | 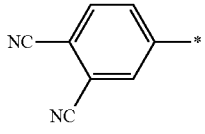 [SMILES: *c1ccc(C#N)c(C#N)c1] | —CN | —H | 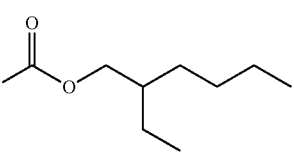 |
| 40 | 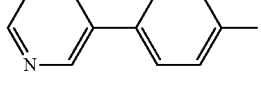 | —CN | —H | 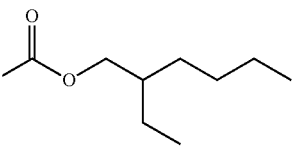 |
| 41 | 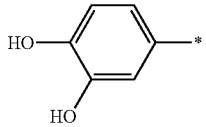 [SMILES: *c1ccc(O)c(O)c1] | —H | —H | 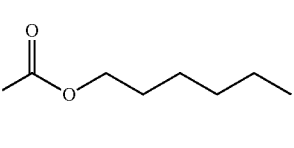 |
| 42 | 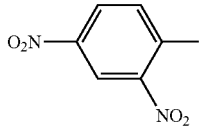 | —H | —H | 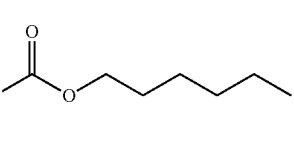 |
| 43 | 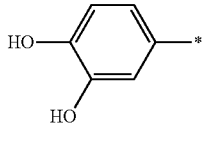 | —CN | —CN | 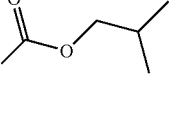 |
| 44 | 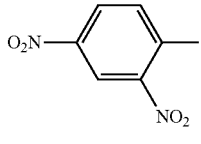 | —CN | —CN | 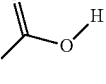 |
| 45 | 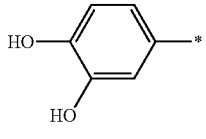 | —H | —CN | 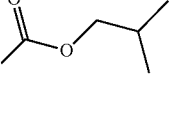 |
| 46 | 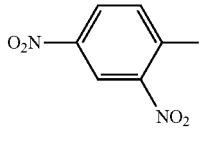 | —H | —CN | 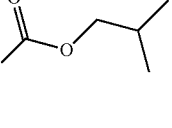 |
| 47 | 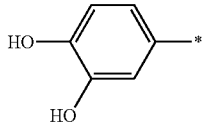 [SMILES: *c1ccc(O)c(O)c1] | —CN | —H | 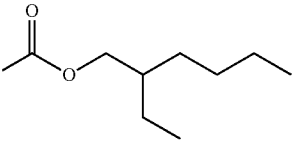 |
| 48 | 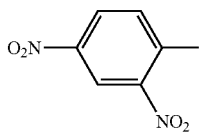 | —CN | —H | 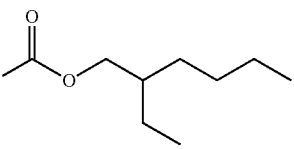 |

TABLE 1-continued

| No. | R$_1$ | R$_2$ | R$_3$ | R$_4$ |
|---|---|---|---|---|
| 49 | 4-phenoxyphenyl | —H | —H | —C(=O)O-n-octyl |
| 50 | 4-(phenylthio)phenyl | —H | —H | —C(=O)O-n-hexyl |
| 51 | 4-phenoxyphenyl | —CN | —CN | —C(=O)O-isobutyl |
| 52 | 4-(phenylthio)phenyl | —CN | —CN | —C(=O)OH |
| 53 | 4-phenoxyphenyl | —H | —CN | —C(=O)O-isobutyl |
| 54 | 4-(phenylthio)phenyl | —H | —CN | —C(=O)O-isobutyl |
| 55 | 4-phenoxyphenyl | —CN | —H | —C(=O)O-CH$_2$CH(C$_2$H$_5$)C$_4$H$_9$ |

TABLE 1-continued

| No. | R₁ | R₂ | R₃ | R₄ |
|-----|----|----|----|----|
| 56 | [phenyl-S-phenyl structure] | —CN | —H | [ester-O-octyl structure] |

In yet another embodiment, the amount of the light absorbing dyes dispersed in the binder resin for the adhesive compositions according to the present invention can be less than 80 parts by weight with reference to a binder resin 100 parts by weight. More specifically, the amount of the light-absorbing dye may be in the range of 30 to 80 parts by weight, 40 to 78 parts by weight or 45 to 75 parts by weight. By controlling the amount of the light-absorbing dye in the above-described range, it is possible to selectively and effectively cut off light in the ultraviolet light without deteriorating the transmittance of light in the visible light region. On the other hand, if the amount of the light-absorbing dyes dispersed in the binder resin exceeds 80 parts by weight with the reference to the binder resin 100 parts by weight, the adhesive strength of the adhesive sheet can be decreased and if the amount of the light-absorbing dye is less than 30 parts by weight, it can be problematic where the light in the ultraviolet region is not effectively cut off because the transmittance in the range of 400-430 nm.

In one embodiment, a mixing ratio of the first light-absorbing dye and the second light-absorbing dye according to the present invention can be in the range of 1:3 to 5:1 weight ratio. Specifically, the mixing ratio of the first light-absorbing dye and the second light-absorbing dye may be in the range of 1:2 to 4.4:1 weight ratio. Since the amount of two light-absorbing dyes stated above are mixed within the range as stated above, it is possible to selectively and effectively cut off light in the ultraviolet light region without deteriorating the transmittance of light in the visible light region.

In addition, the adhesive composition according to the present invention may further include a particulate component dispersed in the binder resin. Specifically, the particulate component may be an average refractive index of 1.3 to 2.1 range or 1.4 to 1.6 range. The particulate component is not particularly limited if it is the case where it has the refractive index as stated above, for example, it may include one or more kinds of metal particles selected from a group consisting of metal oxides, metal nitrides and metal oxynitride; one or more kinds of organic particles selected from a group consisting of silicon and acrylic resin; and either one or both of organic-inorganic particles containing the components constituting the metal particles and the components constituting the organic particles.

For example, the metal particles are one or two or more of mixture of alloy from Zr, Al, Fe, Cu, Ti, Au, Ag, Mg, and Zn and they include oxides, nitrides and/or oxynitrides of the subject metal. For example, the organic particles may be silicon particles or acrylic resin particles in the form of beads. Organic-inorganic particles containing the components constituting the metal particles and the components constituting the organic particles are not also excluded. For example, the component of the particulate above is at least one or more of ZrO2, TiO2, Al2O3, MgO, and SiO2 and the particle shape can be spherical or a variety of polygonal.

The component of the particulate, for example, has the average particle size of the component of the particulate of 0.1 μm to 5 μm, 0.5 μm to 3 μm, 3 μm to 5 μm or 2 μm to 4 μm range. The average particle size of the component of the particulate is taken into consideration for deterioration of the refractive index value or transmittance of light in the visible light region.

If it includes the component of the particulate with the average particle size range stated above, it can scatter to the front by maximizing mie scattering effect and as a result, light straightness with respect to a certain wavelength of light is reduced thereby it can reduce color shift effect caused by color distortion with respect to a viewing angle for the display device.

In addition, the difference in refractive index between the component of the particulate and the binder resin may be 0.05 or more. Difference in refractive index between the component of the particulate and the binder resin may be in the range of, specifically, 0.05 to 0.4, 0.07 to 0.3, or 0.08 to 0.15. By designing the refractive index of the component of the particulate and the binder resin to be differed by more than a predetermined level, there is an effect of increasing the light transmittance in the visible light region.

The binder resin included in the adhesive composition according to the present invention is not particularly limited as long as it is an adhesive resin, and for example, it can use acrylic resins, rubber resins, vinyl resins, silicone resins, polyester resins, polyamide resins and urethane resins or fluorine resins, epoxy resin or a mixture of two kinds of resins stated above. Among them, an acrylic resin may be used by considering its aspect to the weather resistance, cost and the degree of freedom for a type of adhesive material.

In addition, the present invention provides an adhesive layer formed by and adhesive composition stated above or a display device including the adhesive sheet.

As an example, the display device has a structure in which a display panel, a polarizing film, a touch film, and a light transparent window layer are sequentially stacked; and
the adhesive layer may be placed one or more of any positions,
between the display panel and the polarizing film;
inside the polarizing film;
between the polarizing film and the touch film; and
between the touch film
and the transparent window layer.

As another example, the display device has a structure in which a display panel, a touch film, a polarizing film and a light transparent window layer are sequentially stacked; and
the adhesive layer may be placed at one or more of any positions, between the display panel and the touch film;
between the touch film and the polarizing film; and
inside the polarizing film; and
between the polarizing film
and the transparent window layer.

As yet another example, the display device has a structure in which a display panel, a polarizing film, a touch film and a light transparent window layer are sequentially layered and the polarizing film has a multilayer structure including a polarizer, and it may be a structure where an adhesive layer or an adhesive sheet is formed in the closer location to the display panel with respect to the polarizer.

As yet another example, the display device has a structure in which a display panel, a polarizing film, a touch film and a light transparent window layer are sequentially layered and the polarizing film has a multilayer structure including a polarizer, it may be a structure where an adhesive layer or an adhesive sheet is formed in the closer location to the display panel with respect to the polarizer.

The polarizing film may be a multi-layer structure which includes a polarizer and a retardation film. In addition, by forming the adhesive layer or the adhesive sheet to the closer location to the display panel with respect to the polarizer, it is possible to cut off light in the ultraviolet region effectively without affecting the performance of the display device. Here, "closer location to the display panel with respect to the polarizer" means between the polarizer and the display panel. The adhesive layer or the adhesive sheet is located between the display panel and the polarizer, specifically, it may be located at any one or more of the interface between the respective layers where a plurality of optical layers are present between the display panel and the polarizer.

In addition, for the display device, for example, it may be an OLED device. This is in line with a trend of increasing demand for mobile devices employing OLED devices. The display device in accordance with the present invention makes it possible to selectively cut off light in the ultraviolet region and can effectively prevent color changing or color temperature changing due to sunlight exposure.

The display device is applicable to various types of display devices such as a TV, a monitor, a cell phone, a navigation, a notebook or a tablet PC and more specifically it can be a mobile device. In addition, the display device according to the invention includes the adhesive layer formed of the adhesive composition described above, the adhesive sheet or all the cases including a laminated structure, etc.

Below, the present invention will be described in detail through the drawings. However, the description of the drawings is only to illustrate the present invention, thus the content of the present invention is not limited to what is described.

Figure 2:
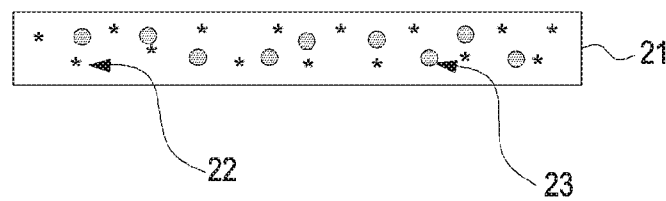
FIG. 2 is a cross-sectional view of an adhesive sheet structure according to another embodiment of the present invention FIGS. 3 and 4, respectively, are a cross-sectional view of an adhesive sheet structure with a release film attached according to one embodiment of the present invention.

In FIG. 1, it is a structure of an adhesive sheet (10) in accordance with one embodiment of the invention where a light-absorbing dye (12) is dispersed in a binder resin (11). In FIG. 2, it is a structure of an adhesive sheet (20) in accordance with other embodiments of the present invention where a light absorbing dye (22) and a particulate component (23) are a dispersed in a binder resin (21). Here, the light absorbing dye (12, 22) can be one or two or more species.

Figure 3:
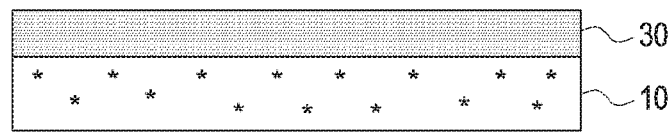
Figure 4:
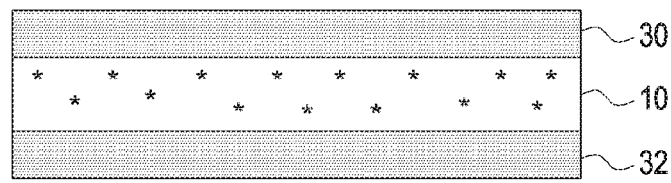

FIG. 3 illustrates a multilayer structure of an adhesive sheet (10) in accordance with one embodiment of the invention where a release film (30) is stacked on one side of the adhesive sheet (10) wherein a light-absorbing dye dispersed. Or, as shown in FIG. 4, the structure includes that release films (31, 32) are formed on both side of the adhesive sheet (10). The release films (30, 31, 32) formed by a processing step on either one side or both side of the adhesive sheet (10) in accordance with the present invention can be removed during a display device manufacturing process.

Figure 5:
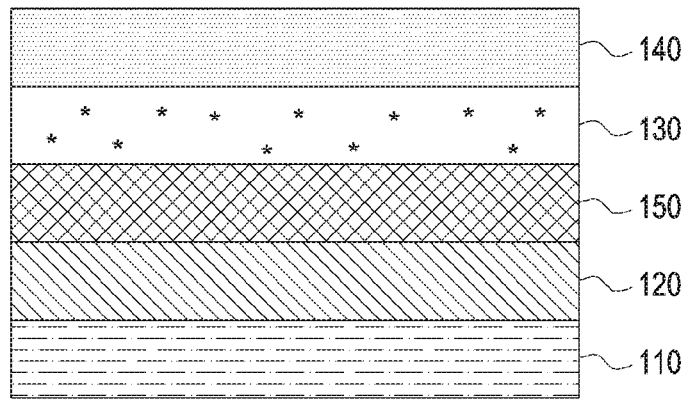
FIGS. 5 to 7, respectively, are a cross-sectional view of a display device structure according to one embodiment of the present invention.

FIG. 5 is a schematic diagram showing a cross-sectional structure of a display device (100) in accordance with one embodiment of the present invention. In FIG. 5, the display device (100) is a structure where an OLED panel (110), a polarizing film (120), a touch film (150), an adhesive layer (130) and a window layer (140) are sequentially stacked. The adhesive layer (130) is a structure where a light-absorbing dyes is dispersed inside. Although it is not shown, it is a structure where the light-absorbing dye and a particulate component can be dispersed together. In addition, the touch film (150) can sense touching when an object is approaching the touch film (150) or is making contact with the touch film (150). The meaning for touching in this case includes not only the case where an external object such as a user's hand is directly making contact with the touch film (150) but also the case where an external object is approaching the touch film 150 or moving while it has approached.

Figure 6:
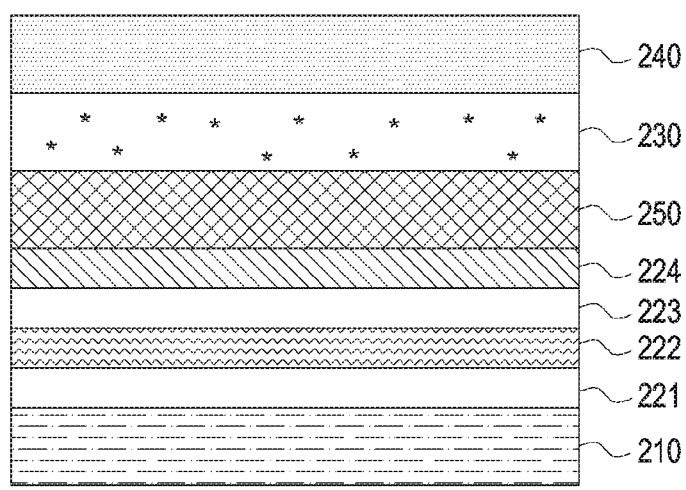

FIG. 6 is a schematic diagram showing a cross-sectional structure of a display device (200) in accordance with another embodiment of the present invention. In FIG. 6, the display device (200) is a structure where an OLED panel (210), a first adhesive layer (221), a polarizing film, a touch film (250), a third adhesive layer (230) and a window layer (240) are sequentially stacked. For the window layer (240), it may use a light transparent plastic or glass substrate. The polarizing film has a structure in which a retardation film (222), a second adhesive layer (223) and a polarizer (224) are sequentially stacked. In summary, the display device (200) shown in FIG. 6 includes the first adhesive layer (220) formed between the OLED panel (210) and the retardation film (222); the second adhesive layer (223) formed between the retardation film (222) and the polarizer (224); and the third adhesive layer formed between the polarizer (224) and the window layer (240) and any one or more of the first to third adhesive layer (221, 223, 230) includes/include the light-absorbing dye dispersed inside. In some cases, any one of the first to third adhesive layer (221, 223, 230) may include the light-absorbing dye or two or three layers all may include the light-absorbing dye.

Figure 7:
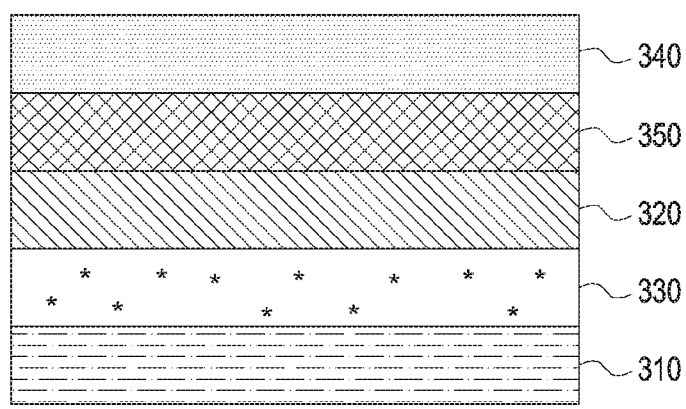

FIG. 7 is a schematic diagram showing a cross-sectional structure of a display device (300) in accordance with another embodiment of the present invention. In FIG. 7, the display device (300) is a structure where an adhesive layer (330) on an OLED panel (310), a polarizing film (320), a touch film (350) and a window layer (340) are sequentially stacked. The adhesive layer (330) has a structure in which a light-absorbing dye is dispersed inside. Although it is not shown, it is a structure where the light-absorbing dye and a particulate component can be dispersed together.

Below, the present invention will be described in detail through the drawings.

However, the description of the drawings is only to illustrate the present invention, thus the content of the present invention is not limited to what is described.

Preparation Example 1: The Preparation of a First Light Absorbing Dye

As a first light absorbing dye, a triazine UV absorber was used. Specifically, a dye having following chemical structure was used.

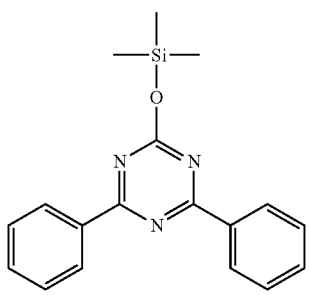 [SMILES: C[Si](C)(C)Oc1nc(-c2ccccc2)nc(-c2ccccc2)n1]

Preparation Example 2: The Preparation of a Second Light-Absorbing Dye

Preparation Example 2-1

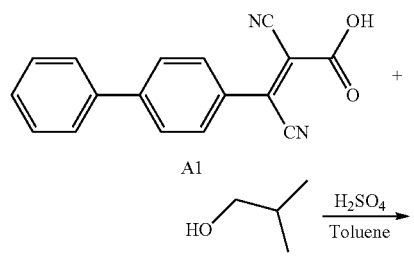

After placing a soxhlet to a 250 ml three ball round shape bottom flask, add toluene (24 ml) and add the chemical formula A1 (18.0 g, 0.065 mol) and the chemical formula B1 (21.9 g, 0.295 mol). After heating to 40° C., add sulfuric acid ($H_2SO_4$, 1.2 g), raise the heating temperature to 120° C. and reflux for 12 hours. Separate the organic layer by adding ether (41 ml) and sodium bicarbonate aqueous solution (49 ml) to the reaction mixture. The desired compound (chemical formula C1, 17.8 g, yield rate: 82%) was obtained by washing the organic layer with distilled water and removing the solvent.

MALDI-TOF: m/z=330.1368 ($C_{21}H_{18}N_2O_2$=330.1).

Preparation Example 2-2

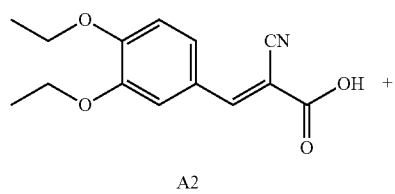

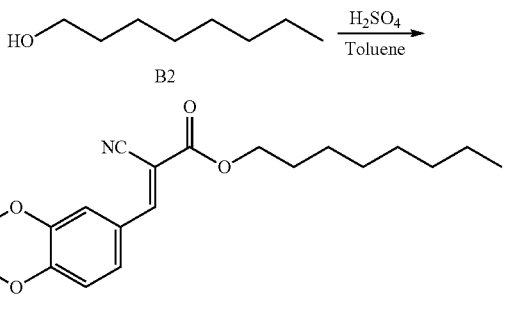

After placing a soxhlet to a 250 ml three ball round shape bottom flask, add toluene (26 ml) and add the chemical formula A2 (19.0 g, 0.072 mol) and the chemical formula B2 (42.6 g, 0.327 mol). After heating to 40° C., add sulfuric acid ($H_2SO_4$, 1.4 g), raise the heating temperature to 120° C. and reflux for 15 hours. Separate the organic layer by adding ether (44 ml) and sodium bicarbonate aqueous solution (51 ml) to the reaction mixture. The desired compound (chemical formula C2, 20.9 g, yield rate: 80%) was obtained by washing the organic layer with distilled water and removing the solvent. MALDI-TOF: m/z=373.2253 ($C_{21}H_{31}NO_4$=373.2).

Preparation Example 2-3

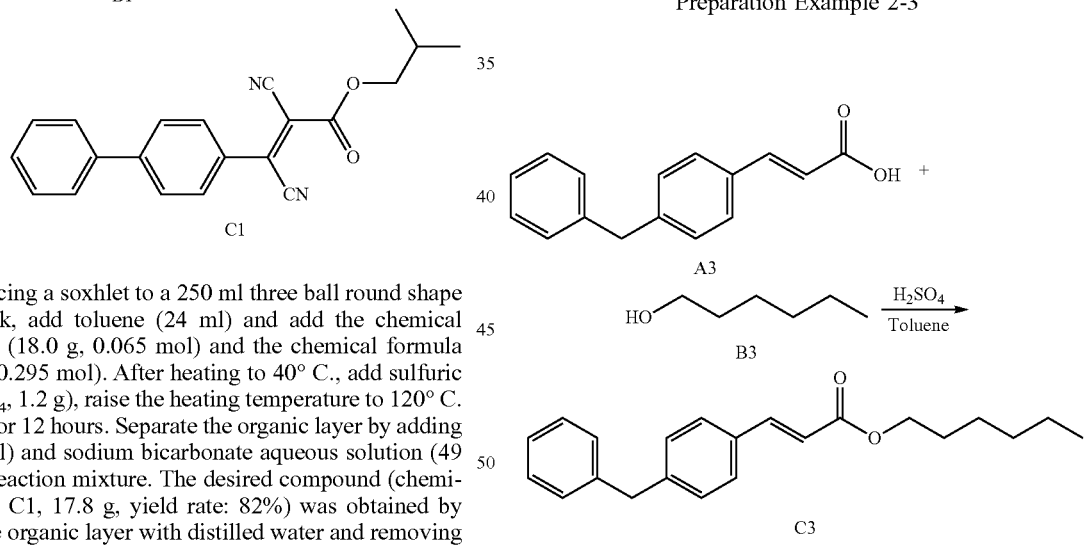

After placing a soxhlet to a 250 ml three ball round shape bottom flask, add toluene (27 ml) and add the chemical formula A3 (20.0 g, 0.083 mol) and the chemical formula B3 (38.6 g, 0.377 mol). After heating to 40° C., add sulfuric acid ($H_2SO_4$, 1.6 g), raise the heating temperature to 120° C. and reflux for 12 hours. Separate the organic layer by adding ether (46 ml) and sodium bicarbonate aqueous solution (54 ml) to the reaction mixture. The desired compound (chemical formula C3, 23.0 g, yield rate: 85%) was obtained by washing the organic layer with distilled water and removing the solvent.

MALDI-TOF: m/z=322.1933 ($C_{22}H_{26}O_2$=322.2).

Preparation Examples 2-4

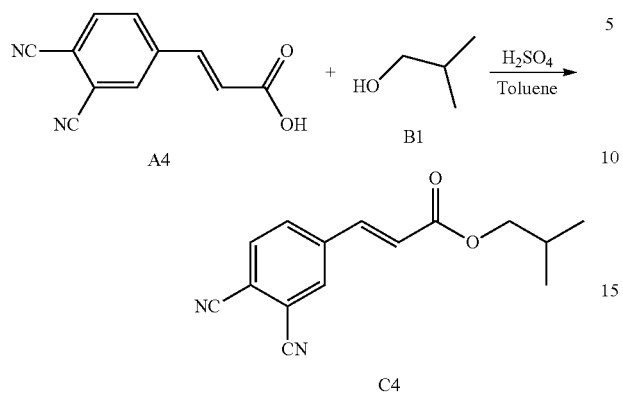

After placing a soxhlet to a 250 ml three ball round shape bottom flask, add toluene (30 ml) and add the chemical formula A4 (22.0 g, 0.111 mol) and the chemical formula B1 (37.0 g, 0.499 mol). After heating to 40° C., add sulfuric acid ($H_2SO_4$, 2.1 g), raise the heating temperature to 120° C. and reflux for 10 hours. Separate the organic layer by adding ether (51 ml) and sodium bicarbonate aqueous solution (59 ml) to the reaction mixture. The desired compound (chemical formula C4, 25.4 g, yield rate: 90%) was obtained by washing the organic layer with distilled water and removing the solvent.

MALDI-TOF: m/z=254.1055 ($C_{15}H_{14}N_2O_2$=254.1).

Preparation Examples 2-5

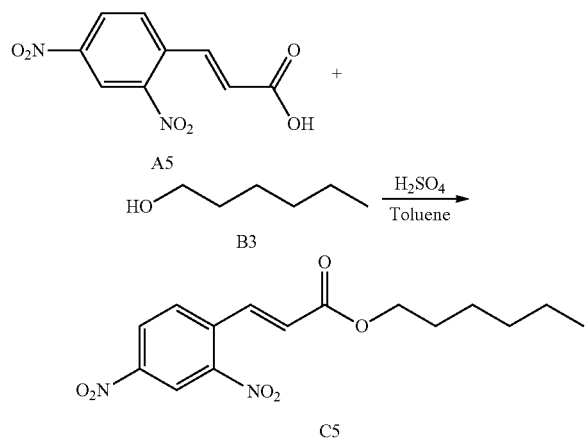

After placing a soxhlet to a 250 ml three ball round shape bottom flask, add toluene (34 ml) and add the chemical formula A5 (25.0 g, 0.104 mol) and the chemical formula B3 (48.2 g, 0.472 mol). After heating to 40° C., add sulfuric acid ($H_2SO_4$, 2.0 g), raise the heating temperature to 120° C. and reflux for 10 hours. Separate the organic layer by adding ether (58 ml) and sodium bicarbonate aqueous solution (68 ml) to the reaction mixture. The desired compound (chemical formula C5, 29.8 g, yield rate: 88%) was obtained by washing the organic layer with distilled water and removing the solvent.

MALDI-TOF: m/z=322.1165 ($C_{15}H_{18}N_2O_6$=322.1).

Preparation Examples 2-6

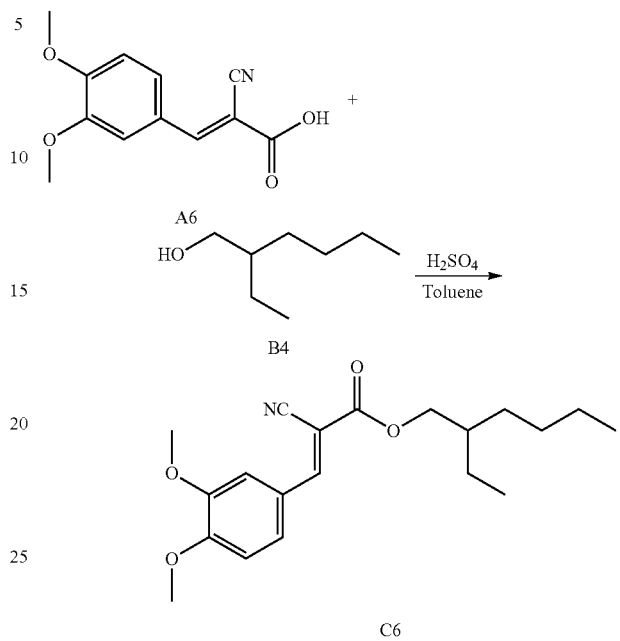

After placing a soxhlet to a 250 ml three ball round shape bottom flask, add toluene (30 ml) and add the chemical formula A6 (22.0 g, 0.094 mol) and the chemical formula B4 (55.3 g, 0.424 mol). After heating to 40° C., add sulfuric acid ($H_2SO_4$, 1.8 g), raise the heating temperature to 120° C. and reflux for 10 hours. Separate the organic layer by adding ether (51 ml) and sodium bicarbonate aqueous solution (58 ml) to the reaction mixture. The desired compound (chemical formula C6, 27.1 g, yield rate: 83%) was obtained by washing the organic layer with distilled water and removing the solvent.

MALDI-TOF: m/z=345.1940 ($C_{20}H_{27}NO_4$=345.2).

Embodiments 1 to 5: Preparation of an Adhesive Sheet

An adhesive composition was prepared by dispersing a light-absorbing dye in a binder resin. The light-absorbing dye was used mixing the first light-absorbing dye according to the preparation example 1 and the second light-absorbing dye according to the preparation example 2-2 and the adhesive composition was prepared by changing the amount of each light-absorbing dye from the samples of the embodiments 1 to 5. A 16 μm thick adhesive sheet was prepared by depositing the prepared adhesive composition on a transparent substrate.

Comparative Examples 1 and 2: Preparation of an Adhesive Sheet

The adhesive sheets were prepared with the same procedure as embodiment 1 except for using a single first light-absorbing dye.

Comparative Examples 3 to 5: Preparation of an Adhesive Sheet

The adhesive sheets were prepared with the same procedure as the embodiment 1 except for using a single second light-absorbing dye.

The adhesive sheet was prepared by changing the ratio of the amount of each light-absorbing dye and binder resin as shown in Table 2 below.

TABLE 2

| No. | First Light Absorption Dye Amount (wt %) | Second Light Absorption Dye Amount (wt %) | Binder Resin Amount (wt %) |
| --- | --- | --- | --- |
| Comp. Example 1 | 31 | — | 69 |
| Comp. Example 2 | 43 | — | 57 |
| Comp. Example 3 | — | 12 | 88 |
| Comp. Example 4 | — | 26 | 74 |
| Comp. Example 5 | — | 29 | 71 |
| Embodiment 1 | 8 | 38 | 54 |
| Embodiment 2 | 15 | 27 | 58 |
| Embodiment 3 | 18 | 21 | 61 |
| Embodiment 4 | 22 | 14 | 64 |
| Embodiment 5 | 27 | 6 | 67 |

Experimental Example 1: Measurement of the light transmittance and the adhesive strength of the adhesive sheet The light transmittance for 405 nm to 550 nm wavelength range and the adhesive strength was measured for the adhesive sheets prepared from Comparative Examples 1 to 5 and Embodiments 1 to 5.

On the other hand, it is for the measurement of the adhesive strength of the adhesive sheets prepared from Comparative Examples 1 to 5 and Embodiments 1 to 5 by using a multi-functional tester, UTM and the adhesive strength was measured after laminating a PET film for the subject adhesive sheet, then laminating the surface of the adhesive sheet with the velocity of 300 m/min with respect to the glass and leaving for 30 minutes at the room temperature.

The experiment results are shown in Table 3 below.

With reference to Table 3, it can be seen that the transmittance with respect to the 410 nm wavelength of the adhesive sheet in Comparative Example 1 is 28.9% but the transmittance with respect to the 405 nm to 550 nm wavelength range of the adhesive sheet according to the Comparative Example 2 could not be measured because the clouding phenomenon occurred.

Furthermore, it was confirmed that the transmittance with respect to the 405 nm to 420 nm wavelength range was lowered when the amount of the second light-absorbing dye was increased for the adhesive sheets in Comparative Examples 3 to 5.

However, when the amount of the dye was increased, i.e., through the low temperature and the thermal shock reliability test in the Comparative Examples 4 and 5, it was confirmed that there was a problem of crystallization of the second light-absorbing dye and deterioration of the adhesive strength.

In addition, the adhesive sheets in accordance with Embodiments 1 to 5 showed that when the amount of the second light-absorbing dye was increased, its transmittance with respect to the 405 nm to 420 nm wavelength range was lowered while the adhesive strength was increased. On the other hand, the transmittance with respect the 405 nm to 550 nm wavelength range could not be measured because the adhesive sheet according to the Embodiment caused the clouding phenomenon.

For reference, the reason for the clouding phenomenon occurring for the Comparative Example 2 and Embodiment 1 was confirmed because there is a compatibility problem between the binder and the light-absorbing dye since the amount of the light-absorbing dye was increased in the binder resin.

Experimental Example 2: Measurement of the amount changing of the color temperature with respect to the amount of the absorbent.

The experiment of 45 times of repeatedly exposing the adhesive sheets prepared in Embodiments 2 to 5 for 8 hours and then shutting exposure for 8 hours under the condition of 85° C. temperature and with sunlight irradiation (using a Xenon lamp) was conducted and the amount of changing of the color temperature before and after the sunlight irradiation was measured.

The experiment results are shown in Table 4 below.

TABLE 3

| No. | Binder Amount (wt %) | Absorbent Amount (wt %) First Dye | Absorbent Amount (wt %) Second Dye | 405 nm | 410 nm | 420 nm | 430 nm | 440 nm | 450 nm | 550 nm | Adhesiveness (gf/inch) |
| --- | --- | --- | --- | --- | --- | --- | --- | --- | --- | --- | --- |
| Comp. Example 1 | 69 | 31 | — | 7.6 | 28.9 | 69.4 | 90.8 | 97.3 | 99.2 | 100.6 | 410 |
| Comp. Example 2 | 55 | 45 | — | — | — | — | — | — | — | — | — |
| Comp. Example 3 | 88 | — | 12 | 7.5 | 30.9 | 80.7 | 96.2 | 99.4 | 100.1 | 100.5 | 399 |
| Comp. Example 4 | 74 | — | 26 | 0.4 | 7.3 | 60.4 | 91.2 | 98.4 | 100.1 | 100.8 | 376 |
| Comp. Example 5 | 71 | — | 29 | 0.1 | 4.3 | 52.6 | 87.8 | 96.9 | 99.0 | 100.0 | 350 |
| Embodiment 1 | 54 | 8 | 38 | — | — | — | — | — | — | — | — |
| Embodiment 2 | 58 | 15 | 27 | 0.1 | 3.5 | 40.5 | 78.3 | 91.5 | 96.1 | 99.3 | 446 |
| Embodiment 3 | 61 | 18 | 21 | 0.3 | 4.1 | 42.6 | 81.1 | 92.7 | 96.8 | 99.5 | 435 |
| Embodiment 4 | 64 | 22 | 14 | 0.2 | 3.8 | 45.2 | 82.4 | 93.5 | 97.9 | 99.2 | 413 |
| Embodiment 5 | 67 | 27 | 6 | 0.1 | 3.9 | 51.9 | 87.6 | 96.8 | 99.1 | 100 | 376 |

TABLE 4

| No. | Sheet Thickness (μm) | Amount (wt %) Binder Resin | First Dye | Second dye | Amount Ratio First Dye | Second Dye | Color Temperature Change |
|---|---|---|---|---|---|---|---|
| Embodiment 2 | 16 | 58 | 15 | 27 | 0.5 | 1.0 | +173 K |
| Embodiment 3 | 16 | 61 | 18 | 21 | 0.9 | 1.0 | +180 K |
| Embodiment 4 | 16 | 64 | 22 | 14 | 1.6 | 1.0 | +196 K |
| Embodiment 5 | 16 | 67 | 27 | 6 | 4.4 | 1.0 | +255 K |

With reference to Table 4, it is confirmed that the amount changing of the color temperature for after the sunlight irradiation is lowered when the amount of the second light-absorbing dye is high. It can be seen that this is effective for cutting off the ultraviolet light.

Moreover, the wavelength value at a point ($T_{20\%}$) where the light transmittance was 20% in the 405 nm to 430 nm wavelength range was measured for the adhesive sheets prepared in accordance with the Embodiments 2 to 5 and the wavelength value at a point ($T_{10\%}$) where the light transmittance was 10% in the 405 nm to 430 nm wavelength range was measured.

As a result, it was confirmed that the difference between the wavelength value ($|T_{20\%}-T_{10\%}|$) was 5 nm or less was confirmed. Specifically, there was difference of 1 nm to 3 nm.

What is claimed is:

1. An adhesive sheet has a structure in which a light-absorbing dye is dispersed in an adhesive binder resin;
    a content of the light-absorbing dye is 80 parts by weight or less with reference to 100 parts by weight of the adhesive binder resin;
    it satisfies following conditions 1 and 2:
    [Condition 1]
    light transmittance for a wavelength of 405 nm is 5% or less;
    light transmittance for a wavelength of 410 nm is 10% or less; and
    light transmittance for a wavelength of 420 nm is less than 60%; and
    [Condition 2]
    light transmittance of more than 75% for 430 nm wavelength; and
    a thickness of the adhesive sheet is 5 μm to 350 μm; and
    the light-absorbing dye comprising a first light-absorbing dye which is a triazine ultraviolet absorber and a second light-absorbing dye represented by following Formula 2:

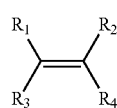

[Formula 2]

in Formula 2,
$R_1$ is represented by following formula 2-a;

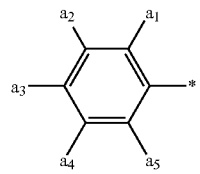

[Formula 2-a]

in Formula 2-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20, or an aryl group having a carbon number of 6 to 18;
R2 and $R_3$ are each independently represented by hydrogen or a cyano group; and
$R_4$ is represented by following formula 2-b; and

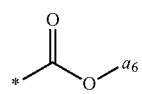

[Formula 2-b]

from Formula 2-b,
$a_6$ is hydrogen or an alkyl group having a carbon number of 1 to 18; and
one or more hydrogen for $R_1$ to $R_4$ from the above formula 2 is each independently substitute or unsubstituted by an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, and one selected from a group consisted of a halogen group, a cyano group, a nitro group, a hydroxyl group and a carboxyl group.

2. The adhesive sheet of claim 1, wherein;
    the first light-absorbing dye of the adhesive sheet is represented by following Formula 1:

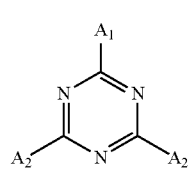

[Formula 1]

in Formula 1, $A_1$, $A_2$ and $A_3$ are each independently, hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

at least one of $A_1$, $A_2$ and $A_3$ is represented by following Formula 1-a; and at least one of $A_1$, $A_2$ and $A_3$ is represented by following Formula 1-b;

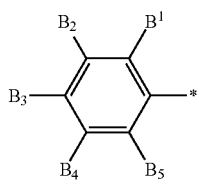

[Formula 1-a]

in Formula 1-a;

$B_1$ to $B_5$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18; and

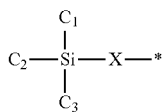

[Formula 1-b]

in Formula 1-b;

$C_1$ to $C_3$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

X represents an oxygen, sulfur or nitrogen atom; and one or more hydrogen of $A_1$, $A_2$ and $A_3$ in Formula 1 are each independently substituted or unsubsituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group a carbon number of 6 to 20, an alkoxycarbonyl group having a carbon number of 1 to 6, a halogen group, a cyano group, a nitro group, a hydroxy group and a carboxyl group.

3. The adhesive sheet of claim 1, wherein;
the adhesive sheet which satisfies following condition 3:

$|T_{20\%} - T_{10\%}| < 5 (nm)$,   [Condition 3]

$T_{20\%}$ represents a wavelength at the point where light transmittance is 20% in a wavelength range of 405 to 430 nm, and $T_{10\%}$ represents a wavelength at the point where the light transmittance is 10% in a wavelength range of 405 to 430 nm.

4. An adhesive composition comprising;
a binder resin;
a light-absorbing dye dispersed in the binder resin, and
wherein the light-absorbing dye comprises a first light-absorbing dye which is a triazine-based ultraviolet absorber and a second light-absorbing dye represented by following Formula 2:

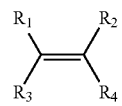

[Formula 2]

in Formula 2,
$R_1$ is represented by following formula 2-a;

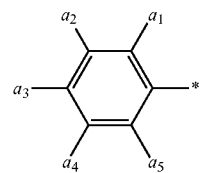

[Formula 2-a]

in Formula 2-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20, or an aryl group having a carbon number of 6 to 18;
$R_2$ and $R_3$ are each independently represented by hydrogen or a cyano group; and
$R_4$ is represented by following formula 2-b; and

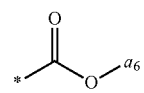

[Formula 2-b]

from Formula 2-b,
$a_6$ is hydrogen or an alkyl group having a carbon number of 1 to 18; and
one or more hydrogen for $R_1$ to $R_4$ from the above formula 2 is each independently substitute or unsubstituted by an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, and one selected from a group consisted of a halogen group, a cyano group, a nitro group, a hydroxyl group and a carboxyl group.

5. The adhesive composition of claim 4, wherein;
the first light-absorbing dye of the adhesive composition is represented by following Formula 1:

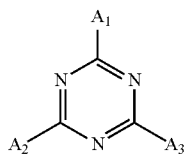

[Formula 1]

in Formula 1, $A_1$, $A_2$ and $A_3$ are each independently, hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

at least one of $A_1$, $A_2$ and $A_3$ is represented by following Formula 1-a; and at least one of $A_1$, $A_2$ and $A_3$ is represented by following Formula 1-b;

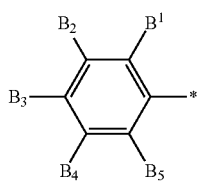

[Formula 1-a]

in Formula 1-a;

$B_1$ to $B_5$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18; and

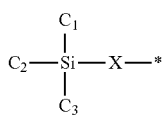

[Formula 1-b]

in Formula 1-b;

$C_1$ to $C_3$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

X represents an oxygen, sulfur or nitrogen atom; and one or more hydrogen of $A_1$, $A_2$ and $A_3$ in Formula 1 are each independently substituted or unsubsituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group a carbon number of 6 to 20, an alkoxycarbonyl group having a carbon number of 1 to 6, a halogen group, a cyano group, a nitro group, a hydroxy group and a carboxyl group.

6. The adhesive composition of claim 4, wherein;

the first light-absorbing dye of the adhesive composition is represented by following Formula 3:

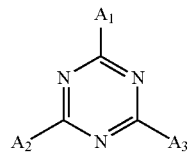

[Formula 3]

in Formula 3, $A_2$ is unsubstituted or a benzene structure substituted with an alkyl group having a carbon number of 1 to 6 or an aryl group having a carbon number of 6 to 20; and $A_1$ is represented by following Formula 3-b; and

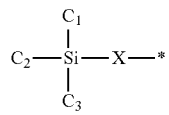

[Formula 3-b]

in Formula 3-b, $C_1$ to $C_3$ are each independently, hydrogen, a hydroxy group, an alkyl group having a carbon number of 1 to 20, an alkoxy group having a carbon number of 1 to 10 or an aryl group having a carbon number of 6 to 18; and X represents an oxygen, sulfur or nitrogen atom.

7. The adhesive composition of claim 4 wherein;

the second light-absorbing dye of the adhesive composition represented by following Formula 2 is represented by following Formula 4:

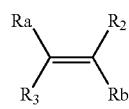

[Formula 4]

in Formula 4, $R_2$ is a cyano group;

$R_3$ is hydrogen; and

Ra is represented by following Formula 4-a;

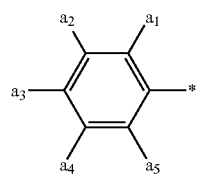

[Formula 4-a]

in Formula 4-a, $a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18; and Rb is represented by following Formula 4-b; and

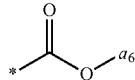
[Formula 4-b]

in Formula 4-b,
$a_6$ is hydrogen or an alkyl group having a carbon number of 1 to 10; and
one or more hydrogen of $R_2$, $R_3$, Ra and Rb in Formula 4 are each independently substituted or unsubstituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, a halogen group, a cyano group, a nitro group, a hydroxyl group and a carboxy group.

8. The adhesive composition of claim 4, wherein;
a content of the light-absorbing dye is in 30 to 80 parts by a weight range with reference to 100 parts by weight of the binder resin.

9. The adhesive composition of claim 4, wherein;
a mixing ratio of the first light-absorbing dye and the second light-absorbing dye is in 1:3 to 5:1 weight ratio range.

10. The adhesive composition of claim 4, further comprising;
a particulate component having an average refractive index in a range of 1.3 to 2.1.

11. The adhesive composition of claim 10, further comprising;
the particulate component including one or more kinds of metal particles selected from a group consisting of metal oxides, metal nitrides and metal oxynitride;
one or more kinds of organic particles selected from a group consisting of silicon and acrylic resin; and
an organic-inorganic particle containing a component constituting the metal particle and a component constituting the organic particle.

12. The adhesive composition of claim 10, wherein;
an average particle diameter of the particulate component is in a range of 0.1 μm to 5 μm.

13. The adhesive composition of claim 10, wherein;
a difference in refractive index between the particulate component and the binder resin is 0.05 or more.

14. A display device comprising an adhesive layer formed by the adhesive composition according to claim 4.

15. The display device of claim 14, wherein;
the display device has a structure in which a display panel, a polarizing film, a touch film and a light transparent window layer are sequentially stacked; and
the adhesive layer is formed at any one or more positions, between the display panel and the polarizing film;
inside the polarizing film;
between the polarizing film and the touch film; and
between the touch film and the transparent window layer.

16. The display device of claim 14, wherein;
the display device has a structure in which a display panel, a touch film, a polarizing film and a light transparent window layer are sequentially stacked; and
the adhesive layer is formed at any one or more positions, between the display panel and the touch film;
between the touch film and the polarizing film; and
inside the polarizing film; and
between the polarizing film and the transparent window layer.

17. The display device of claim 14, comprising;
a display panel, a polarizing film, a touch film, and a light transparent window layer wherein;
the polarizing film is a multilayer structure including a polarizer; and
an adhesive layer formed by the adhesive composition according to claim 4;
the adhesive layer is located between the display panel and the polarizer.

18. An adhesive sheet has a structure in which a light-absorbing dye is dispersed in an adhesive binder resin;
a content of the light-absorbing dye is 80 parts by weight or less with reference to 100 parts by weight of the adhesive binder resin;
it satisfies following conditions 1 and 2:
[Condition 1]
light transmittance for a wavelength of 405 nm is 5% or less;
light transmittance for a wavelength of 410 nm is 10% or less; and
light transmittance for a wavelength of 420 nm is less than 60%; and
[Condition 2]
light transmittance of more than 75% for 430 nm wavelength; and
a thickness of the adhesive sheet is 5 m to 350 m; and
the light-absorbing dye comprising a first light-absorbing dye which is a triazine ultraviolet absorber and a second light-absorbing dye represented by following Formula 2:

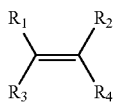
[Formula 2]

in Formula 2,
$R_1$ is represented by following formula 2-a;

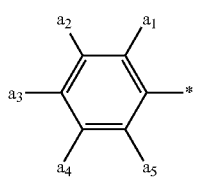
[Formula 2-a]

in Formula 2-a,
$a_1$ to $a_5$ are each independently hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20, or an aryl group having a carbon number of 6 to 18;

R2 and R$_3$ are each independently represented by hydrogen or a cyano group; and R$_4$ is represented by following formula 2-b; and

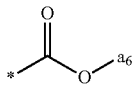

[Formula 2-b]

from Formula 2-b, a$_6$ is hydrogen or an alkyl group having a carbon number of 1 to 18; and one or more hydrogen for R$_1$ to R$_4$ from the above formula 2 is each independently substitute or unsubstituted by an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group having a carbon number of 6 to 20, an alkoxycarbonyl group having a carbon number of 1 to 6, and one selected from a group consisted of a halogen group, a cyano group, a nitro group, a hydroxyl group and a carboxyl group, wherein the first light-absorbing dye of the adhesive sheet is represented by following Formula 1:

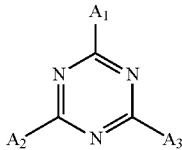

[Formula 1]

in Formula 1,

A$_1$, A$_2$ and A$_3$ are each independently, hydrogen, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

at least one of A$_1$, A$_2$ and A$_3$ is represented by following Formula 1-a; and at least one of A$_1$, A$_2$ and A$_3$ is represented by following Formula 1-b;

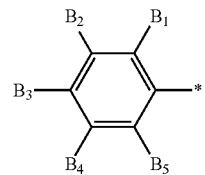

[Formula 1-a]

in Formula 1-a;

B$_1$ to B$_5$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18; and

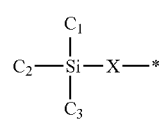

[Formula 1-b]

in Formula 1-b;

C$_1$ to C$_3$ are each independently, hydrogen, a hydroxy group, an alkyl group having a carbon number of 1 to 20, a cycloalkyl group having a carbon number of 3 to 20, an alkoxy group having a carbon number of 1 to 10, an aralkyl group having a carbon number of 7 to 20 or an aryl group having a carbon number of 6 to 18;

X represents an oxygen, sulfur or nitrogen atom; and one or more hydrogen of A$_1$, A$_2$ and A$_3$ in Formula 1 are each independently substituted or unsubsituted with one selected from a group consisting of an alkyl group having a carbon number of 1 to 6, an alkenyl group having a carbon number of 1 to 6, an alkoxy group having a carbon number of 1 to 6, an aryl group having a carbon number of 6 to 20, a heteroaryl group having a carbon number of 2 to 20, an aryloxy group having a carbon number of 6 to 20, an arylthio group a carbon number of 6 to 20, an alkoxycarbonyl group having a carbon number of 1 to 6, a halogen group, a cyano group, a nitro group, a hydroxy group and a carboxyl group.

* * * * *